(12) United States Patent
Wu et al.

(10) Patent No.: US 9,807,912 B2
(45) Date of Patent: Oct. 31, 2017

(54) HEAT DISSIPATING SYSTEM FOR DATA CENTER

(71) Applicant: HON HAI PRECISION INDUSTRY CO., LTD., New Taipei (TW)

(72) Inventors: Hui-Feng Wu, New Taipei (TW); Hung-Chou Chan, New Taipei (TW); Chih-Hung Chang, New Taipei (TW); Ching-Bai Hwang, New Taipei (TW); Chih-Yuan Lin, New Taipei (TW); Pei-Pin Pai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 173 days.

(21) Appl. No.: 14/928,427

(22) Filed: Oct. 30, 2015

(65) Prior Publication Data

US 2017/0094839 A1    Mar. 30, 2017

(30) Foreign Application Priority Data

Sep. 24, 2015   (TW) .................................. 104131662

(51) Int. Cl.
*H05K 7/20* (2006.01)
*F24F 11/00* (2006.01)

(52) U.S. Cl.
CPC ...... *H05K 7/20836* (2013.01); *F24F 11/0015* (2013.01); *H05K 7/20745* (2013.01)

(58) Field of Classification Search
CPC ............. F24F 11/0015; H05K 7/20181; H05K 7/20618; H05K 7/20745; F25B 2700/02
See application file for complete search history.

(56) References Cited

U.S. PATENT DOCUMENTS

| 2011/0239683 A1* | 10/2011 | Czamara | H05K 7/20745 |
| | | | 62/259.4 |
| 2014/0340842 A1* | 11/2014 | Towner | F24F 6/02 |
| | | | 361/679.48 |
| 2015/0016056 A1* | 1/2015 | Endo | H05K 7/20745 |
| | | | 361/679.49 |

* cited by examiner

*Primary Examiner* — Cassey D Bauer
(74) *Attorney, Agent, or Firm* — Steven Reiss

(57) ABSTRACT

A heat dissipating system for a data center includes a return air area and an installation area. The return air area defines a return air damper and an air outlet, and the installation area defines an air inlet damper and an air outlet damper. The installation area includes a fan control unit, a humidity control unit and an electronic device. When the humidity control unit detects that the humidity value in the installation area is greater than a standard value, the humidity control unit controls the return air damper to partly open. Warmed air generated by the electronic device partly flows to the return air area through the return air damper, and the cold air and the warmed air are mixed. The mixed air is configured to dissipate heat for the electronic device, and the humidity in the data center is reduced.

10 Claims, 5 Drawing Sheets

HEAT DISSIPATING SYSTEM FOR DATA CENTER

FIELD

The subject matter herein generally relates to a heat dissipating system, and particularly relates to a heat dissipating system for a data center.

BACKGROUND

In order to allow certain electronics to function properly the ambient temperature may need to be maintained at a cool temperature. More and more data centers use cold air from outside to dissipate heat.

BRIEF DESCRIPTION OF THE DRAWINGS

Implementations of the present technology will now be described, by way of example only, with reference to the attached figures.

DETAILED DESCRIPTION

Figure 1:
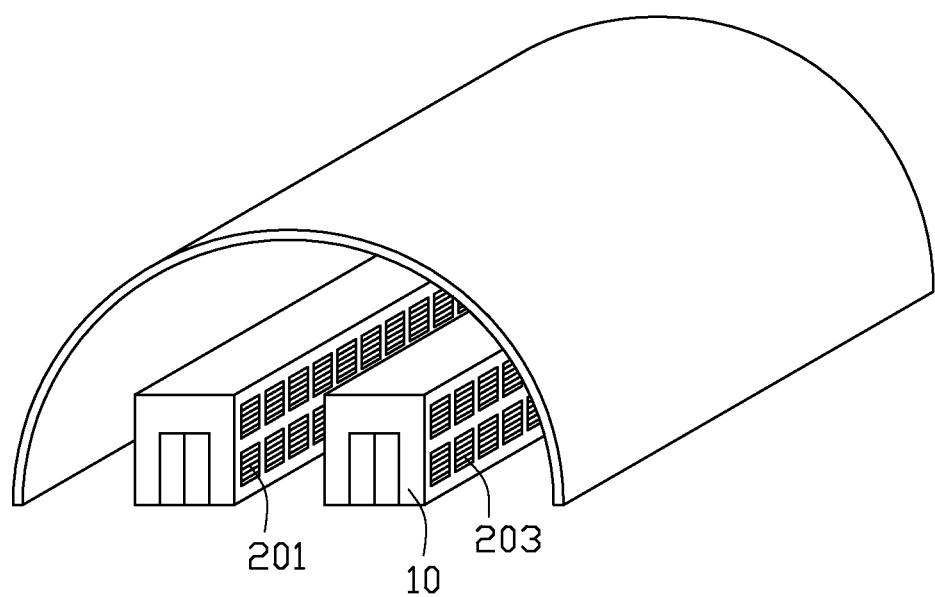
FIG. 1 is a location diagram of a first embodiment of a heat dissipating system for a data center, wherein the data center is located in a tunnel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure relates to a heat dissipating system for a data center.

FIG. 1 illustrates a first exemplary embodiment of a heat dissipating system for a data center 100. A plurality of data centers 100 are located parallel and spaced from each other in a tunnel.

Figure 2:
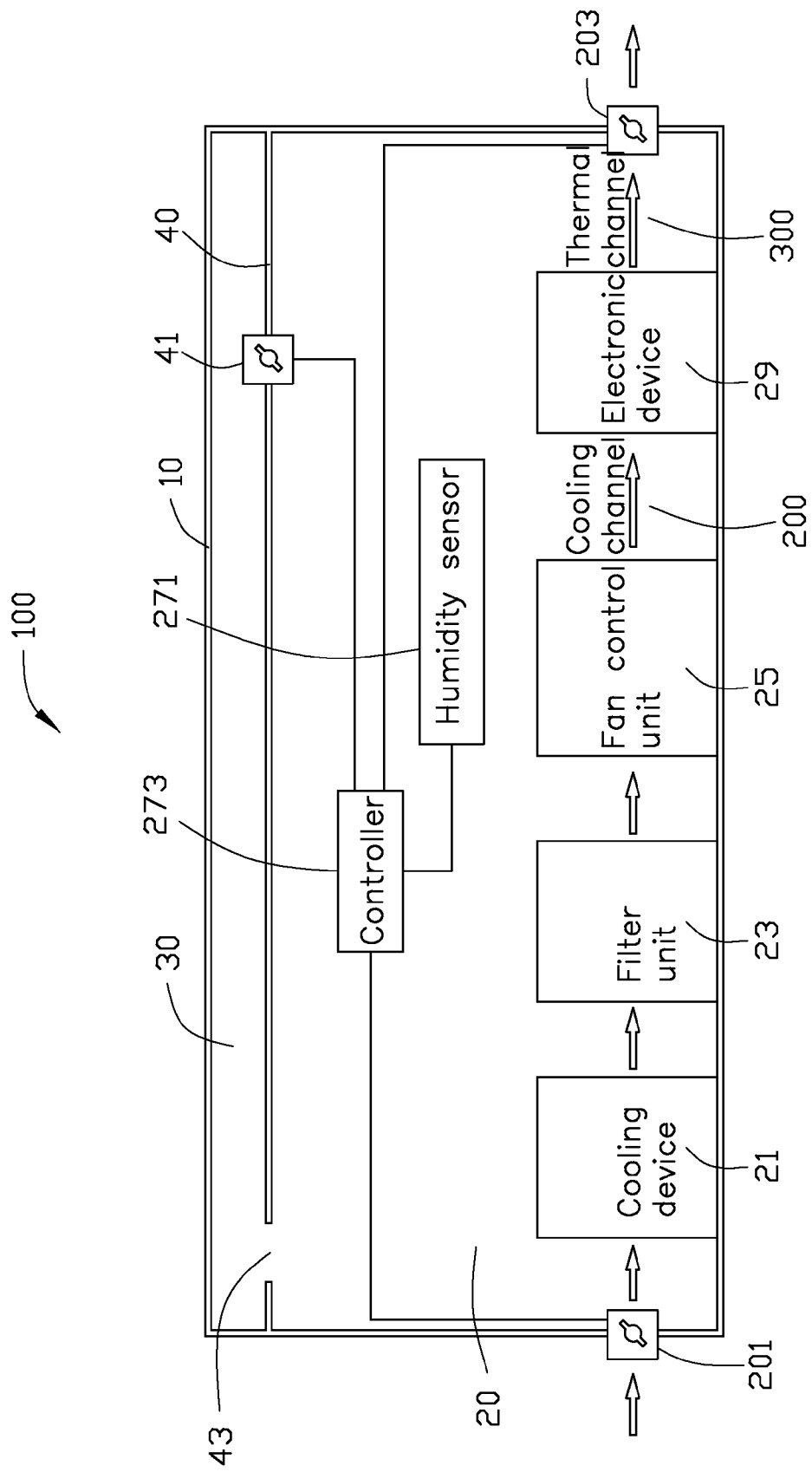
FIG. 2 is a schematic diagram of the first embodiment of a heat dissipating system for a data center.
Figure 3:
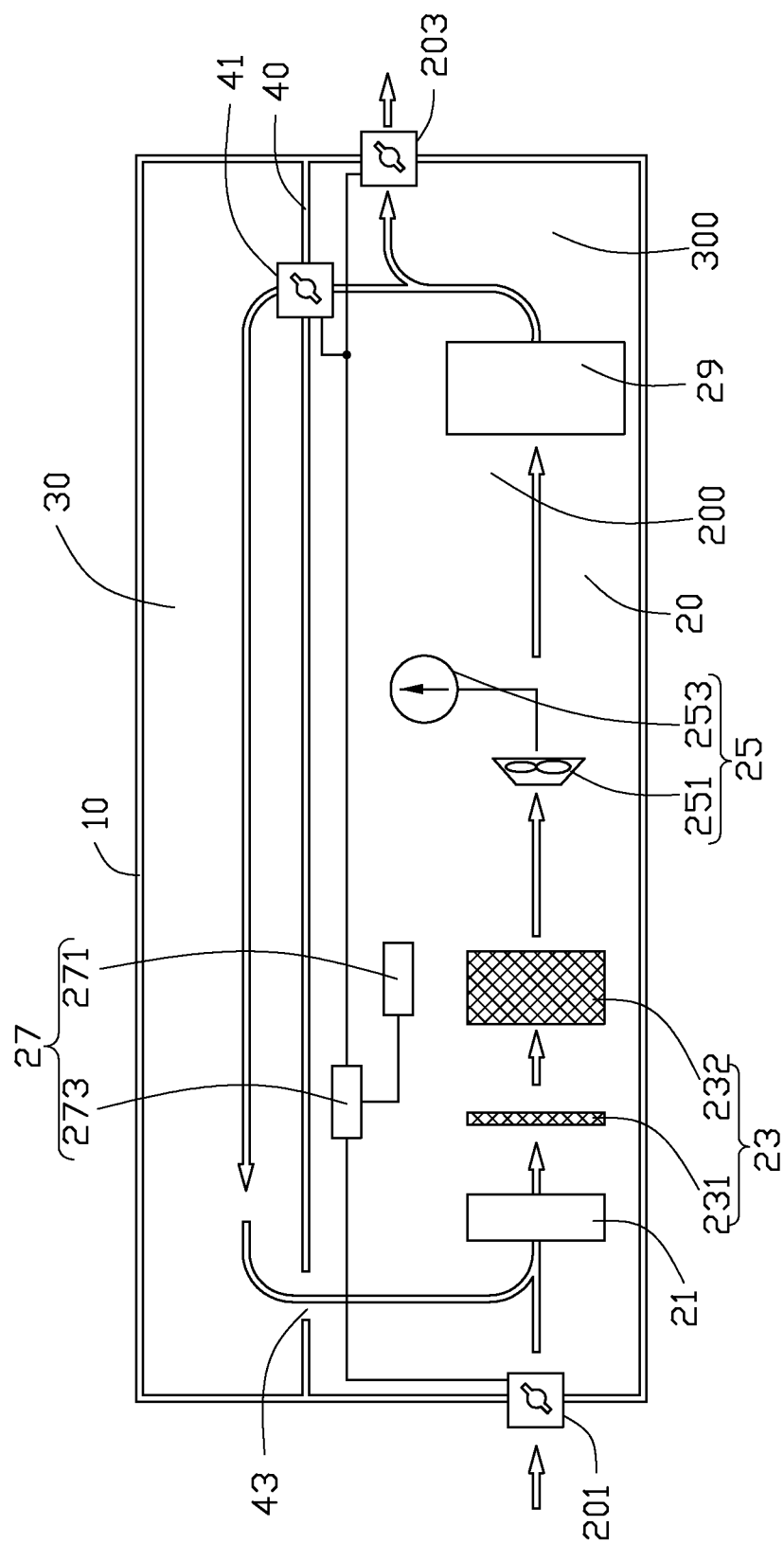
FIG. 3 is a composition diagram of the first embodiment of a heat dissipating system for a data center.

FIG. 2 and FIG. 3 illustrate that each of the data centers 100 comprises an enclosure 10. The enclosure 10 defines an installation area 20 and a return air area 30. The installation area 20 and the return air area 30 are separated by a separating member 40. A cooling device 21, a filter unit 23, a fan control unit 25, a humidity control unit 27 and an electronic device 29 are installed in the installation area 20. A cooling aisle 200 is formed between the fan control unit 25 and the electronic device 29. A hot aisle 300 is formed between the electronic device 29 and a side wall of the enclosure 10. A return air damper 41 is installed on one side of the separating member 40 adjacent to the electronic device 29. Another side of the separating member 40 defines an air outlet 43 adjacent to the cooling device 21.

An air inlet damper 201 is installed on one side of the enclosure 10 of the installation area 20, and an air outlet damper 203 is installed on an opposite side of the enclosure 10 of the installation area 20. Cooling air in the tunnel can flow into the data center 100 through the air inlet damper 201. Warmed air generated by electronic device 29 can be exhausted out the enclosure 10 of the data center 100 through the air outlet damper 203. The warmed air generated by electronic device 29 can be transmitted into the return air area 30 through the return air damper 41.

The filter unit 23 comprises a first filter screen 231 and a second filter screen 232 located parallel behind the first filter screen 231. The first filter screen 231 and the second filter screen 232 can filter the cold air entering the data center 100 through the air inlet damper 201.

The fan control unit 25 comprises a plurality of fans 251 located between the second filter screen 232 and the electronic device 29 and an air sensor 253 coupled to the fans 251. The air sensor 253 can control a direction and a speed of the fans 251.

The humidity control unit 27 comprises a humidity sensor 271 and a controller 273 coupled to the humidity sensor 271. The humidity sensor 271 can detect a humidity value in the data center 100. The controller 273 is coupled to the air inlet damper 201, the air outlet damper 203, and the return air damper 41. The controller 273 can control the air inlet damper 201, the air outlet damper 203 and the return air damper 41 to open or close.

The plurality of the data centers 100 can be located parallel to and spaced from each other in the tunnel. The air outlet dampers 203 of the data centers 100 are facing the wall of the tunnel. The warmed air generated by the data center 100 is exhausted out through the air outlet dampers 203 facing the wall of the tunnel, to prevent the wall of the tunnel from freezing. The cold air in the tunnel flows into the enclosure 10 of the data center 100 through the air inlet damper 201 and is preliminarily filtered by the first filter screen 231 and is further filtered by the second filter screen 232 after being cooled by the cooling device 21. The filtered cold air flows to the fans 251, and the air sensor 253 controls the direction and speed of the cold air by controlling the fans 251. The cold air is transmitted to the electronic device 29 through the cooling aisle 200 and dissipates heat from the electronic device 29. The warmed air generated by the electronic device 29 is exhausted out of the enclosure 10 through the hot aisle 300 and the air outlet damper 203. Furthermore, the air sensor 253 can prevent the warmed air generated by the electronic device 29 from returning to the cooling aisle 200.

Figure 4:
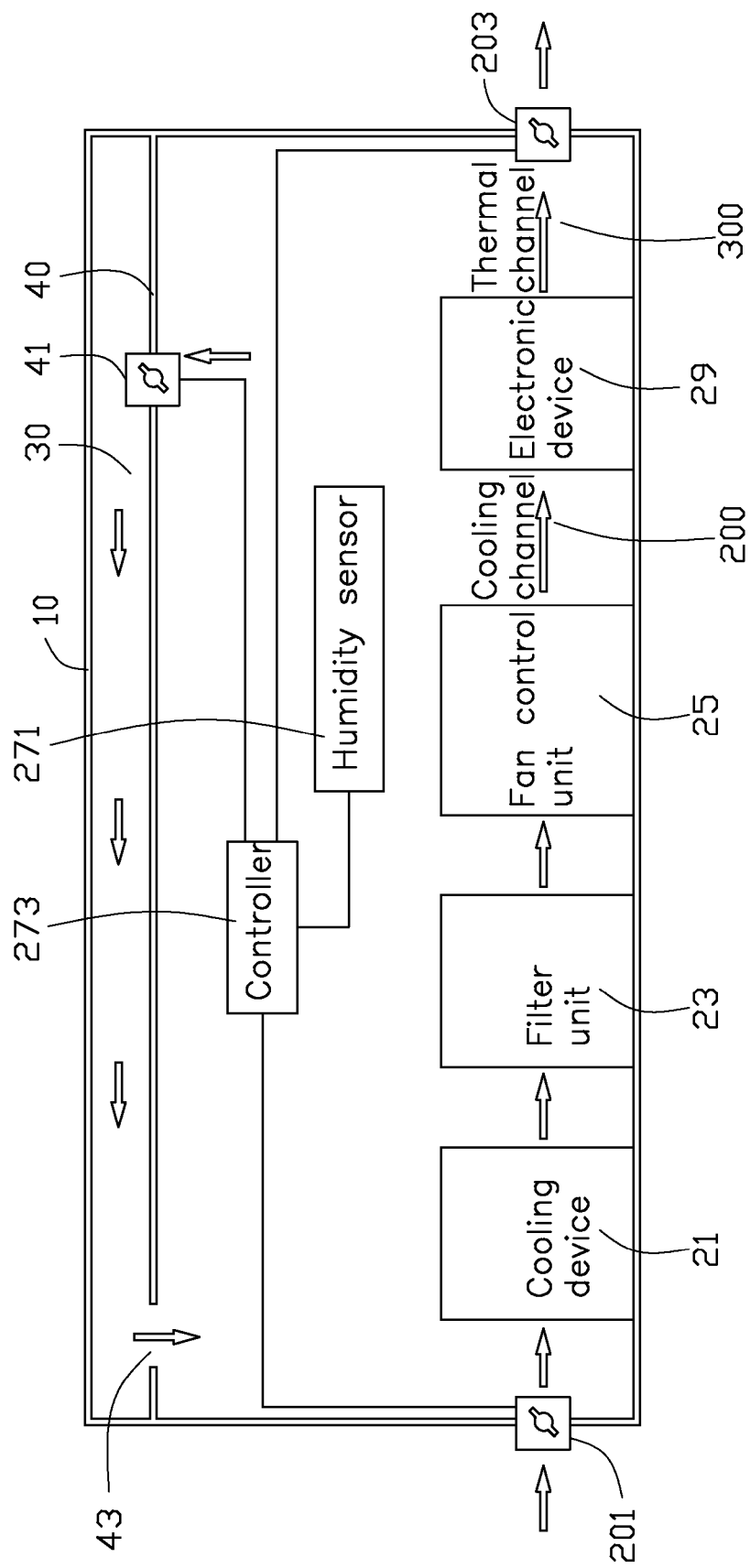
FIG. 4 is a wind direction diagram of the first embodiment of a heat dissipating system for a data center.

FIG. 4 is a wind direction diagram of the first embodiment of a heat dissipating system for a data center. The humidity sensor 271 detects the humidity value of the enclosure 10 and transmits the humidity value to the controller 273. The controller 273 determines whether the humidity value of the enclosure 10 is greater than a standard value preset in the controller 273. When the humidity value of the enclosure 10 is greater than the standard value preset in the controller 273, the controller 273 controls the return air damper 41 to partly open. The warmed air generated by the electronic device 29 partly flows to the return air area 30 through the return air damper 41, and flows into the installation area 20 through the air outlet 43. The cold air in the data center 100 from the tunnel through the air inlet damper 201 and the hot air from the return air area 30 generated by the electronic device 29 are mixed, and cooled by the cooling device 21. The mixed air is preliminarily filtered by the first filter screen 231 and is further filtered by the second filter screen 232, and is transmitted to the fans 251. The air sensor 253 controls the direction and speed of the mixed air by controlling the fans 251. The cold air is transmitted to the electronic device 29 through the cooling aisle 200 and dissipates heat from the electronic device 29. The warmed air generated by the electronic device 29 is partly exhausted out the enclosure 10 through the hot aisle 300 and the air outlet damper 203. Furthermore, the air sensor 253 can prevent the warmed air generated by the electronic device 29 from returning to the cooling aisle 200. Therefore, the humidity in the data center 100 is reduced. The controller 273 can control the return air damper 41 to open or close based on the humidity value. For example, if the humidity value of the enclosure 10 is greater than a percent (such as 80%) of the standard value set by the controller 273, the controller 273 controls the return air damper 41 to partly open; if the humidity sensor 271 detects that the humidity value of the enclosure 10 is still greater than the percent of the standard value set by the controller 273 after a default time (such as 5 minutes), the controller 273 controls the return air damper 41 to entirely open. The percent can be adjusted as needed.

When the controller 273 controls the return air damper 41 to entirely open and the humidity sensor 271 detects that the humidity value of the enclosure 10 is still greater than the percent of the standard value preset in the controller 273, the controller 273 controls the air inlet damper 201 to reduce the opening. The cold air in the tunnel reduces flow to the data center 100 through the air inlet damper 201, and the humidity in the data center 100 is reduced.

When the air inlet damper 201 is entirely closed and the humidity sensor 271 detects that the humidity value of the enclosure 10 is still greater than the percent of the standard value set by the controller 273, the controller 273 controls the air outlet damper 203 to close. The warmed air generated by the electronic device 29 flows into the return air area 30 through the return air damper 41 and flows into the installation area 20 through the air outlet 43. The hot air is cooled by the cooling device 21 and is preliminarily filtered by the first filter screen 231 and is further filtered by the second filter screen 232. The cold air cooled by the cooling device 21 flows to the electronic device 29 through the fans 251 and the cooling aisle 200, to dissipate heat from the electronic device 29.

Figure 5:
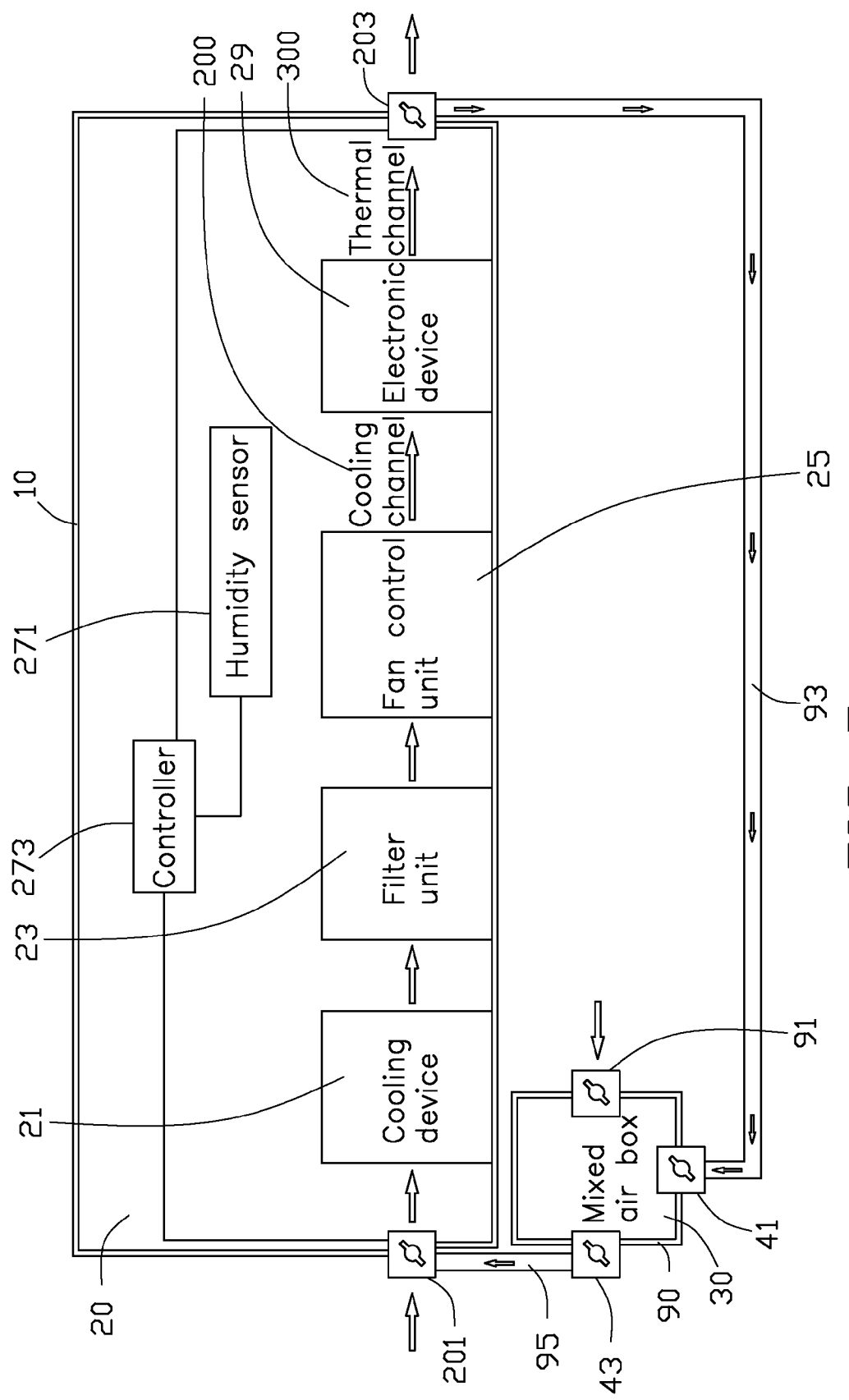
FIG. 5 is a schematic diagram of a second embodiment of a heat dissipating system for a data center.

FIG. 5 is a second embodiment of a heat dissipating system for a data center. The data center 100 comprises an enclosure 10 and a mixed air box 90. The difference from the first embodiment of a heat dissipating system for a data center is that: the return air area 30 is defined in the mixed air box 90, and the return air damper 41 and the air outlet 43 are installed on the mixed air box 90. The air outlet damper 203 is coupled to the return air damper 41 through a first duct 93, and the air inlet damper 201 is coupled to the air outlet 43 of the mixed air box 90 through a second duct 95. The mixed air box 90 further defines an air inlet 91. The cold air in the tunnel flows to the mixed air box 90 through the air inlet 91, and flows to the enclosure 10 of the data center 100 successively through the air outlet 43, the second duct 95 and the air inlet damper 201 to dissipate heat from the electronic device 29.

When the humidity sensor 271 detects that the humidity value of the enclosure 10 is greater than the standard value set by the controller 273, the controller 273 controls the return air damper 41 to partly open. The warmed air generated by the electronic device 29 flows to the mixed air box 90 successively through the air outlet damper 203, the first duct 93 and the return air damper 41. The cold air in the mixed air box 90 from the tunnel through the air inlet 91 is mixed with the warmed air generated by the electronic device 29 in the mixed air box 90, and the mixed air flows to the enclosure 10 of the data center 100 successively through the air outlet 43, the second duct 95 and the air inlet damper 201, to dissipate heat from the electronic device 29.

When the controller 273 controls the return air damper 41 to entirely open and the humidity sensor 271 detects that the humidity value of the enclosure 10 is still greater than the percent of the standard value set by the controller 273, the controller 273 controls the air inlet 91 to reduce the opening. The cold air in the tunnel reduces flow to the data center 100 through the air inlet 91, and the humidity in the data center 100 is reduced.

When the air inlet damper 201 is entirely closed, and the humidity sensor 271 detects that the humidity value of the enclosure 10 is still greater than the percent of the standard value set by the controller 273, the controller 273 controls the air outlet damper 203 to close. The warmed air generated by the electronic device 29 flows into the air mixed box 90 through the first duct 93 and the return air damper 41 and flows into the enclosure 10 successively through the air outlet 43, the second duct 95 and the air inlet damper 201, to dissipate heat from the electronic device 29 by the cooling device 29.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A heat dissipating system for a data center, the heat dissipating comprising:
  a return air area defining a return air damper and an air outlet; and
  an installation area defining an air inlet damper and an air outlet damper, the installation area comprising:
    a fan control unit configured to control heat dissipation from the electronic device in the data center;
    a humidity control unit configured to detect a humidity in the data center and controls the air inlet damper, the air outlet damper and the return air damper to open or close based on the humidity; and
    an electronic device;
  wherein outside air is configured to flow into the installation area through the air inlet damper, and warmed air generated by the data center is exhausted from out the data center through the air outlet damper;

wherein in event that the humidity control unit detects that the humidity value in the installation area is greater than a standard value, the humidity control unit controls the return air damper to partly open, so that warmed air generated by the electronic device partly flows the return air area through the return air damper, the outside air and the warmed air from the return air area generated by the electronic device are mixed, the mixed air is configured to dissipate heat from the electronic device, whereby the humidity in the data center is reduced.

2. The heat dissipating system of claim 1, wherein the heat dissipating system further comprises an enclosure defining the return air area and the installation area, the return air area and the installation area are separated by a separating member, the return air damper is defined on one side of the separating member adjacent to the electronic device, and the air outlet is defined on another side of the separating member adjacent to air inlet damper.

3. The heat dissipating system of claim 2, wherein a plurality of the data center are located parallel to and spaced from each other in a tunnel, and the warmed air generated by the data center and exhausted out through the air outlet dampers is facing the wall of the tunnel, to prevent the wall of the tunnel from freezing.

4. The heat dissipating system of claim 2, wherein a cooling aisle is formed between the fan control unit and the electronic device, and a hot aisle is formed between the electronic device and a side wall of the enclosure.

5. The heat dissipating system of claim 4, wherein the fan control unit comprises a plurality of fans and an air sensor coupled to the fans, the air sensor is configured to control a direction and a speed of the fans to prevent the warmed air generated by the electronic device from returning to the cooling aisle, and the air sensor is configured to exhaust the warmed air generated by the electronic device out the data center through the hot aisle and the air outlet damper.

6. The heat dissipating system of claim 1, wherein the heat dissipating system further comprises a filter unit, the filter unit comprises a first filter screen and a second filter screen located parallel behind the first filter screen, the outside air is preliminarily filtered by the first filter screen and is further filtered by the second filter screen.

7. The heat dissipating system of claim 6, wherein the installation area further comprises a cooling device, the cooling device is located between the air inlet damper and the filter unit.

8. The heat dissipating system of claim 1, wherein the humidity control unit comprises a humidity sensor and a controller coupled to the humidity sensor, the humidity sensor is configured to detect the humidity value in the data center, the controller is coupled to the air inlet damper, the air outlet damper and the return air damper, the controller is configured to control the air inlet damper, the air outlet damper and the return air damper to open or close, when the humidity sensor detects that the humidity value of the installation area is greater than a percent of the standard value, the controller controls the return air damper to partly open, and when the humidity sensor detects that the humidity value of the installation area is still greater than the percent of the standard value after a default time, the controller controls the return air damper to entirely open.

9. The heat dissipating system of claim 8, wherein in event that the controller controls the return air damper to entirely open and the humidity sensor detects that the humidity value of the installation area is still greater than the percent of the standard value, the controller controls the air inlet damper to reduce a size of the opening; in event that the air inlet damper is entirely closed and the humidity sensor detects that the humidity value of the installation area is still greater than the percent of the standard value, the controller controls the air outlet damper to close.

10. The heat dissipating system of claim 1, wherein the heat dissipate system further comprises an enclosure and a mixed air box, the return air area is defined in the mixed air box, the return air damper and the air outlet are installed on the mixed air box, the mixed air box further defines an air inlet to transmit the cold air to the mixed air box, the air outlet damper is coupled to the return air damper through a first duct, the air inlet damper is coupled to the air outlet of the mixed air box through a second duct, the warmed air generated by the electronic device flows to the mixed air box through the air outlet damper, the first duct and the return air damper, the cold air in the mixed air box from outside is mixed with the warmed air generated by the electronic device in the mixed air box, and the mixed air flows to the enclosure of the data center successively through the air outlet and the air inlet damper, to dissipate heat from the electronic device.

* * * * *